United States Patent
Leon et al.

(10) Patent No.: US 8,102,057 B2
(45) Date of Patent: Jan. 24, 2012

(54) VIA DESIGN FOR FLUX RESIDUE MITIGATION

(75) Inventors: Alexander Leon, Santa Clara, CA (US); Rosa Reinosa, Palo Alto, CA (US); Michael David Carothers, San Jose, CA (US); Glen Griffiths, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1127 days.

(21) Appl. No.: 11/645,908

(22) Filed: Dec. 27, 2006

(65) Prior Publication Data
US 2008/0160252 A1      Jul. 3, 2008

(51) Int. Cl.
*B32B 3/24* (2006.01)
(52) U.S. Cl. ......... 257/774; 257/E23.011; 257/E23.174; 257/E21.578; 257/E21.586; 174/263; 174/265
(58) Field of Classification Search .................. 257/774, 257/E23.011, E23.174, E23.578, E21.586; 174/263, 265
See application file for complete search history.

(56) References Cited

U.S. PATENT DOCUMENTS

| | | | | |
|---|---|---|---|---|
| 3,243,498 A | * | 3/1966 | Lowell et al. | 174/266 |
| 4,806,111 A | * | 2/1989 | Nishi et al. | 439/109 |
| 4,935,284 A | * | 6/1990 | Puerner | 428/137 |
| 5,841,196 A | * | 11/1998 | Gupta et al. | 257/774 |
| 6,054,377 A | * | 4/2000 | Filipiak et al. | 438/619 |
| 6,171,968 B1 | | 1/2001 | Hsu | |
| 6,181,219 B1 | * | 1/2001 | Gailus et al. | 333/33 |
| 6,229,101 B1 | * | 5/2001 | Sekiya et al. | 174/266 |
| 6,252,266 B1 | | 6/2001 | Hoshi et al. | |
| 6,400,172 B1 | * | 6/2002 | Akram et al. | 324/765 |
| 6,667,551 B2 | * | 12/2003 | Hanaoka et al. | 257/750 |
| 7,615,707 B2 | * | 11/2009 | Lin | 174/262 |
| 2002/0125577 A1 | * | 9/2002 | Komada | 257/774 |
| 2004/0016114 A1 | * | 1/2004 | McAllister et al. | 29/830 |
| 2004/0118605 A1 | * | 6/2004 | van der Laan | 174/262 |
| 2004/0262040 A1 | * | 12/2004 | Ishizuka et al. | 174/262 |
| 2005/0128672 A1 | * | 6/2005 | Tourne et al. | 361/119 |
| 2006/0170110 A1 | * | 8/2006 | Akram et al. | 257/774 |

* cited by examiner

*Primary Examiner* — Eugene Lee
*Assistant Examiner* — Peniel M Gumedzoe

(57) ABSTRACT

Provided is an electrically conductive via for reducing flux residue. The via has a first aperture having a first diameter size. The via further has a second aperture having a second diameter size. A chamber is disposed between the first aperture and the second aperture, the chamber having a third diameter size. At least one of the diameters being of a different dimension than the other two. In addition, the via may also provide improved test point access in addition to reducing flux residue.

20 Claims, 11 Drawing Sheets

CHAMBERED VIA

FIG. 9
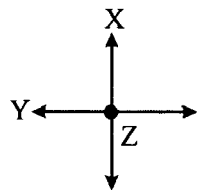
FLARED VIA
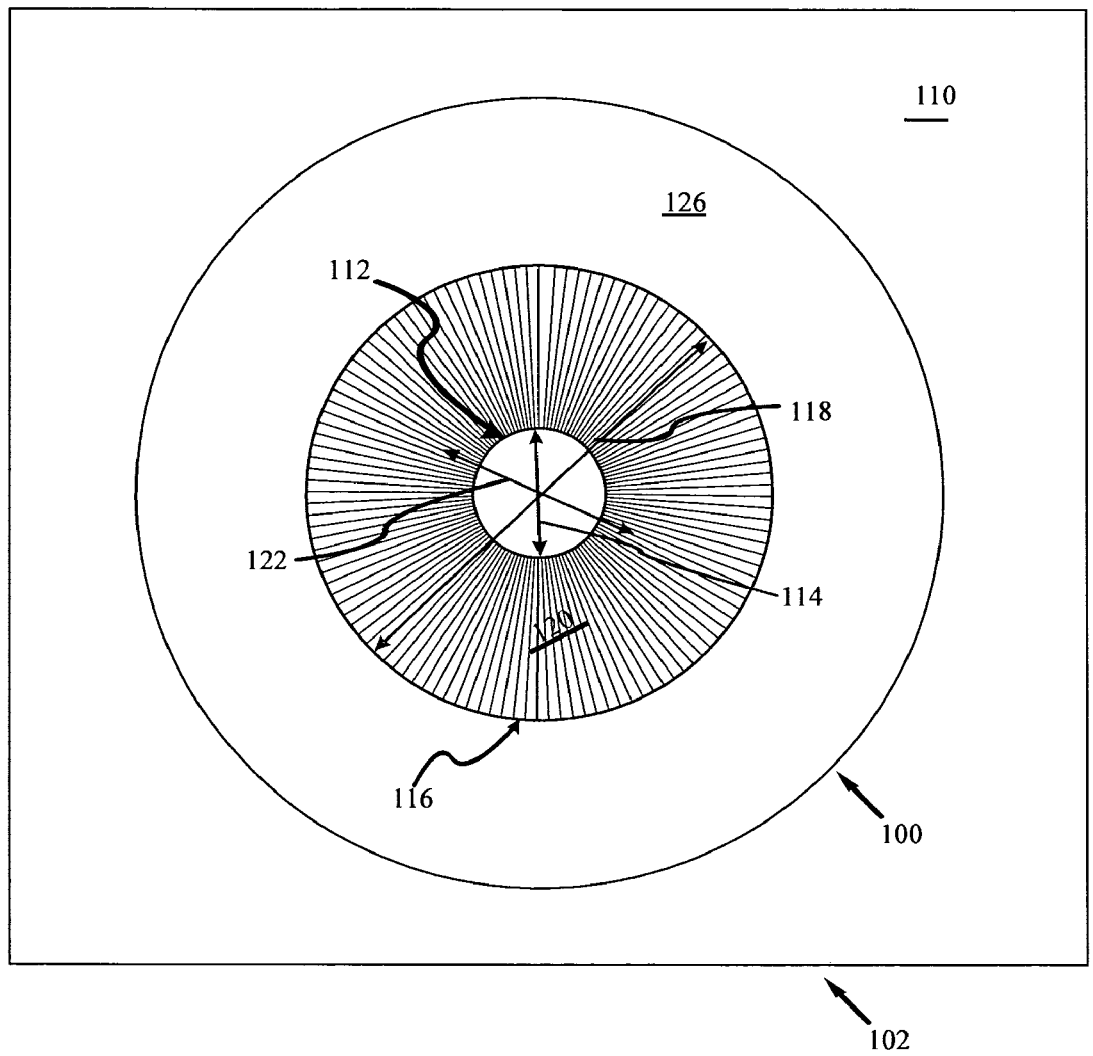

VIA DESIGN FOR FLUX RESIDUE MITIGATION

FIELD

This invention relates generally to the field of electrical vias for receiving test probes and, in particular, to a via for reducing flux residue and improving test point-access.

BACKGROUND

Typically, modern electrical products incorporate printed circuit assemblies (PCAs), such as printed circuit boards (PCBs). The range of products is immense, including cell phones, laptops, televisions, MP3 players, game consoles, personal data assistants and aircraft components, to name just a few.

The printed circuits within these products interconnect a variety of circuit components, such as diodes, transistors, resistors, integrated circuits and the like. Fabricated as individual components, each generally has one or more balls, legs or pins (commonly referred to as interconnects). The individual components are brought into useful harmony by a circuit board that provides electrical traces to and from different components as well as areas that facilitate the permanent mounting of components upon the board.

Due to fabrication complexity of many products, the PCAs are assembled in stages. A given PCA and at least some of the components thereon may therefore be subjected to repeated processing steps. As such, the components frequently require monitoring and testing during the fabrication process to ensure that the ultimate device is functional. If an uncorrectable defect is detected early, additional fabrication costs may be saved by halting further assembly of the defective product.

Electrical test probes are used to provide electrical connections between PCA components and testing instruments. An electrical test probe generally consists of an electrically-conductive probing tip joined to an electrically-conductive shaft that is, in turn, connected to a test fixture, which attempts to align the probe to a specific component.

Generally speaking, the components are attached to the PCA by solder. Economic and environmental factors have effected a change in the solder process from lead-based solder to lead-free solder. The use of lead-free solder imposes additional fabrication issues upon the assembly and testing process. For through-hole-technology (THT) components, the process and costs of wave soldering can be eliminated by assembling these to the board using through-hole reflow (THR). THR is a way to mount THT components simultaneously with the surface-mount-technology (SMT) components. In other situations, a through-hole, or via, may connect a designated test pad on one side of the PCA, with a trace or-mounting pad for a component on the other side of the PCA or trace internal to the PCA. To provide good test pad surfacing, solder reflow is generally the preferred method of applying solder to the test pad area.

In addition, as the industry further miniaturizes devices, packing more components within the same area, it becomes more and more difficult to provide accessible test points of suitable size to ensure quality testing is achieved. Moreover, while there is a desire to maximize components in minimum space, this desire is somewhat offset by the need to insure that test points are provided with sufficient access for testing.

Typically, the solder is applied in a paste form with the use of a stencil to the circuit-board. In some instances, components are then pressed into the solder paste, and/or into holes in the board along with solder paste. In other instances, the solder paste is simply applied to provide a-good test pad surface for test probe contact. The board is then heated to the solder melt temperature to reflow the solder such that it wets a pad surface and/or flows about the pins of a component to be joined to the board.

In addition to the solder metal, the solder paste also contains a combination of chemicals, called flux, which help keep the solder in a paste form, act as adhesive so the paste sticks to the pads and pins, thereby holding the components on the board before being reflowed, and clean the metal of pads and pins in order to achieve a good solder joint. The reflowing process releases the flux components of the paste and leaves flux residue on the board and solder joints. The flux residue is a combination of non-conductive materials.

Holes in the board are frequently used to mount components and/or provide board interconnections. When the reflowed solder flows into these holes, it may partially or completely fill them. Flux material also will flow into the hole and gather on top of the reflowed solder. The flux material may lie below the pad of the hole, be flush with it, or flood over it.

In many instances, the hole, or via, as it is more commonly known, is intended to permit electrical connectivity from one side of the board to the other for component testing purposes. Specifically, as the components attached to one side may effectively block or reduce the space available for testing pads, it is frequently common to have the testing pads provided on the opposite side of the board. To provide a quality surface for testing, solder paste and reflowing operations are performed on the test pads of such vias.

When the hole and/or its surrounding pad are the target of a test probe, the flux residue may prevent a reliable and-repeatable electrical connection between the pad and the target when urged with each other. Also, a certain amount of force is generally used when the test probe tip is urged into the solder. If too much force is applied, this may break solder joints, components or the board itself. If too little force is applied, the probe may not make sufficient contact with the solder and a valid component may be judged to be defective. Thus, a low force that repeatedly makes good electrical contact between a test probe and its target is desirable.

As conventional through holes have a consistent diameter, during the reflow process, solder and flux will flow into the hole and the flux having been separated from the solder, will pool on top of the solder. The solder within the hole will generally form a concave meniscuses, which is in turn filled by the flux residue. The flux is, of course, non-conductive. The flux typically will pool and overflow the hole so as to cover and effectively seal the test pad contacts as well.

As most conventional test probe tips are generally in the shape of a cone or other shape that narrows to a point, the pooled flux may well frustrate the ability to make electrical contact between the probe tip and the test pad. As such, the testing may fail despite the node actually being properly functional.

Probe tips in the shapes of cups, crowns and radial stars with three or more tips for alignment over mounded solder elements also exist. However, as the number of contact points increases, so too does the surface area of contact. More specifically, as the points of contact increase, the concentration of applied force transferred to each point decreases.

Thus, the multiplicity of points of contact from start tips, crown tips or the like may further frustrate the attempt to achieve a proper electrical contact between the probe tip and the solder if blocking flux residue is present. Single flat blade probe tips are likewise also frustrated by the presence of flux, as they provide a large surface area for contact and, thus, result in lower contact pressure per unit of contact area.

In short, flux residue presents a serious issue for test probes in that the flux may foul the probe tip and so retard later testing ability, and the flux may prevent electrical contact between the probe tip and the test pad, thus resulting in a potentially erroneously failed test.

Consequently, the necessary electrical contact between the probe and the solder is not achieved in all situations and the testing system may wrongly evaluate a healthy board and/or component as defective, due simply to the contact failure. Also, bad contact may lead to incorrectly passing a bad board. Such incorrect evaluations are costly, either due to costly troubleshooting involved, good product becoming scrapped, or profitability being impacted by bad product becoming deployed and, in turn, necessitating costly customer support under warranty.

Hence, there is a need for a through-hole via that overcomes one or more of the drawbacks identified above.

SUMMARY

This invention provides a electrically conductive via for reducing flux residue.

In particular, and by way of example only, according to an embodiment, provided is an electrically conductive via for reducing flux residue, including: a first aperture having a first diameter size; a second aperture having a second diameter size; a chamber between the first aperture and the second aperture, the chamber having a third diameter size; and at least one of the-diameters being of a different dimension than the other two.

BRIEF DESCRIPTION OF THE DRAWINGS

FIG. 9 is a bottom view of the FRMV shown in either FIG. 7 or FIG. 8;

DETAILED DESCRIPTION

Before proceeding with the detailed description, it is-to be appreciated that the present teaching is by way of example, not by limitation. The concepts herein are not limited to use or application with a specific light guide screen. Thus, although the instrumentalities described herein are, for the convenience of explanation, shown and described with respect to exemplary embodiments, it will be appreciated that the principles herein may be equally applied in other types of dual arcuate blade probes.

Figure 1:
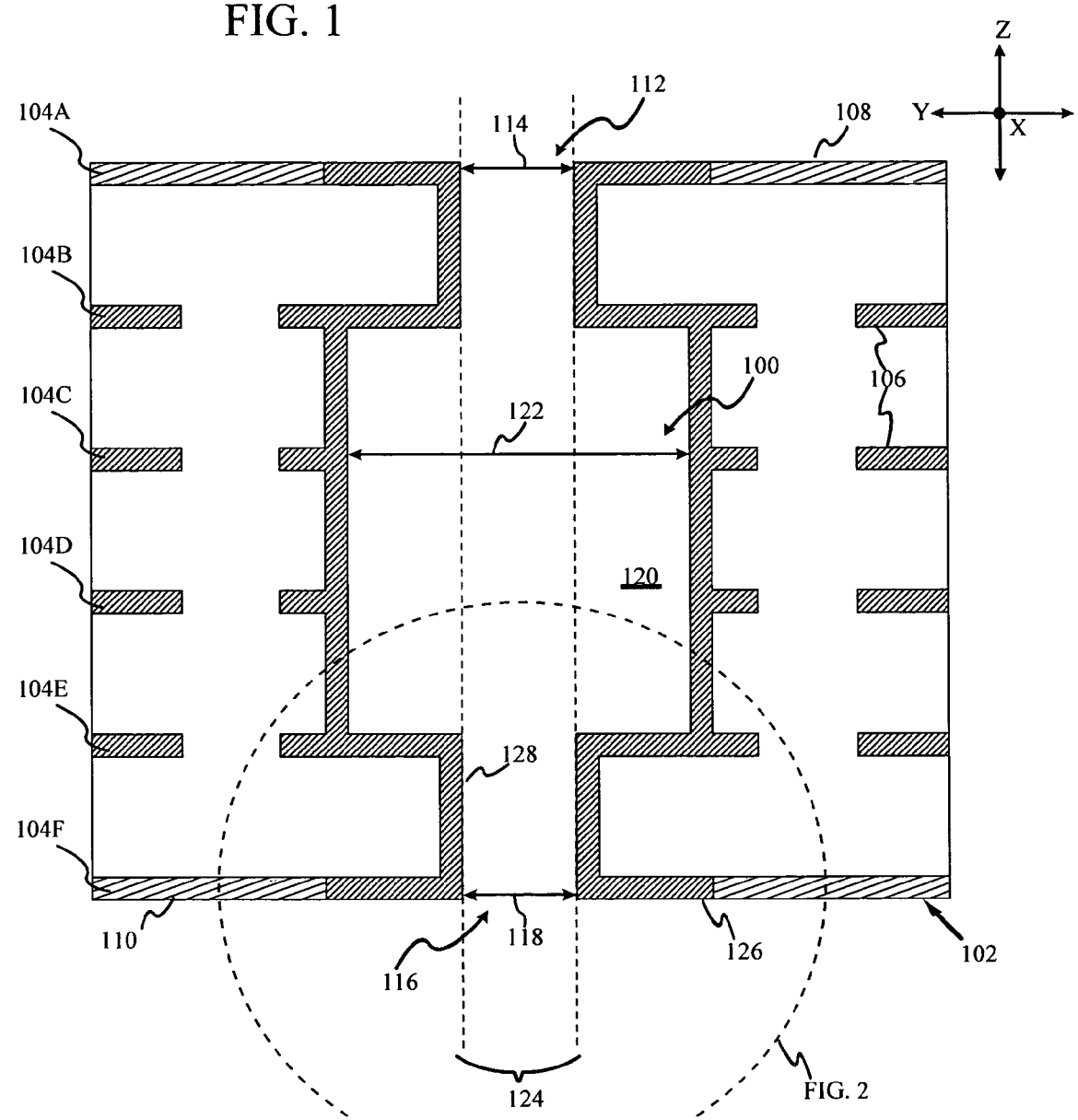
FIG. 1 is a cross-sectional view of a flux residue mitigating via ("FRMV") according to at least one embodiment.

Turning now to the figures, and more specifically FIG. 1, there is shown an electrically conductive flux residue mitigating via ("FRMV") 100. More specifically, FIG. 1 is a partial cross-section view of a printed circuit assembly ("PCA") 102 composed of multiple circuit board layers 104, of which six layers 104A~104F indicated by electrical traces 106 are exemplary. PCA 102 provides a first side 108 and a second side 110, and as shown, FRMV 100 is disposed to provide contact through PCA 102 from the first side 108 to the second side 110. For purposes of this example, second side 110 is shown to be the test probe contact side. As shown, FRMV 100 may make contact with electrical traces 106 that exist within PCA 102 between the first side 108 and second side 110.

To facilitate the description, the orientations are referenced to the coordinate system with three axes orthogonal to one another, as shown in FIG. 1. The axes intersect mutually at the origin of the coordinate system which is intended to be the center of the PCA 102. The axes shown in all figures are offset from their actual locations for clarity of illustration. Moreover, FIG. 1 is understood to be a cross-sectional view of the YZ plane through PCA 102.

Extending through the PCA 102 from the first side 108 to the second side 110 is FRMV 100. As shown, FRMV 100 provides at the first side 108 a first aperture 112 having a first diameter 114 and at the second side 110 a second aperture 116 having a second diameter 118. Disposed between the first aperture 112 and the second aperture 116 is a chamber 120, the chamber having a third diameter 122. As parallel dotted reference lines 124 indicate, the first diameter 114 and second diameter 118 are the same, whereas the third diameter 122 is of a different dimension, i.e. greater. In other words, FRMV 100 has at least three diameters, at least one diameter being of a different dimension than the other two.

Figure 2:
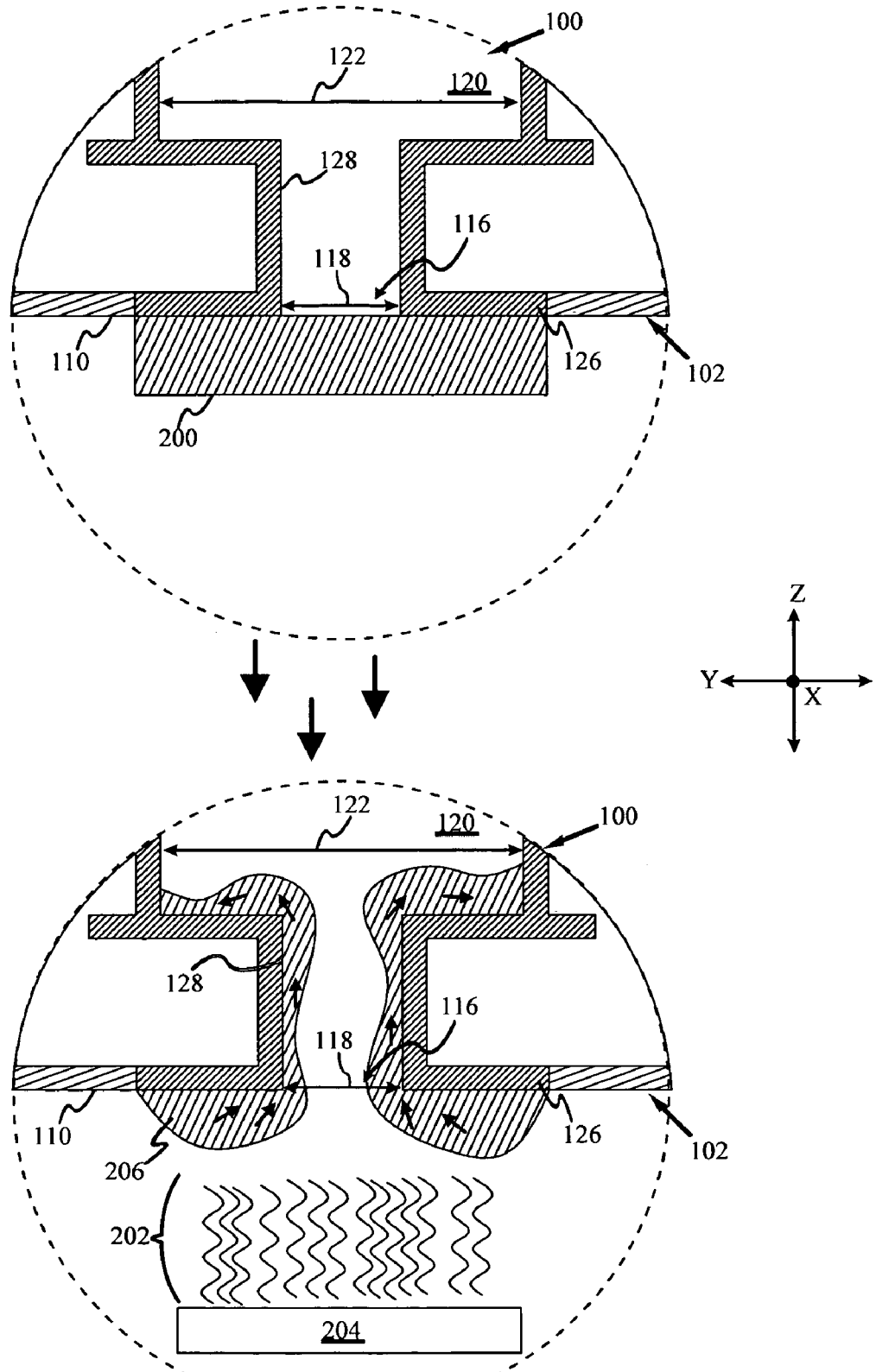
FIG. 2 is a partial view of the FRMV in FIG. 1 illustrating the solder reflow process.

As shown in FIG. 1, FRMV 100 provides a solder receiving test pad 126 concentrically joined to the second aperture 116. FIG. 2 presents a portion of FRMV 100 shown in FIG. 1 to partially illustrate the solder pasting and rewetting process during the reflow process. With respect to FIG. 2, it is generally understood and appreciated -that solder paste 200 is applied to the pad 126 with the use of a stencil, not shown.

Figure 3:
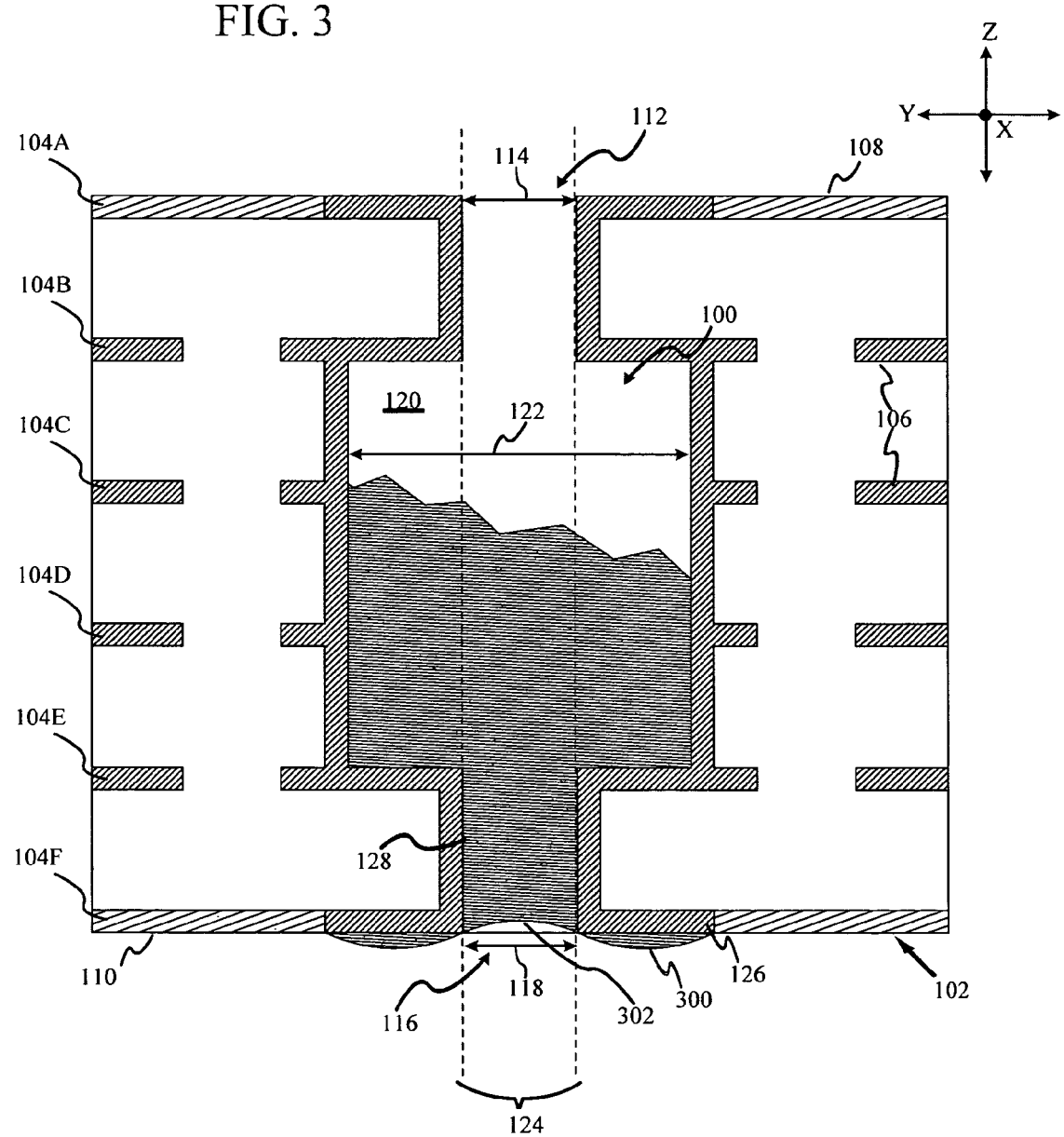
FIG. 3 is a cross-sectional view of the FRMV shown in FIG. 1 further illustrating reflowed solder.

During the reflow process shown in the lower half of FIG. 2, heat 202 provided by a heat source 204 is applied to the solder paste 200 such that the solder and flux liquefy. Due, at least in part, to wetting force and/or capillary action, the liquefied solder and flux 206 will flow along pad 126, into the second aperture 116 and along the sidewalls 128 of the FRMV 100. As the reflow process is shown to be in process the liquefied solder and flux 206 is not shown to be flowing into the second aperture 116 and has not yet assumed the final form as shown in FIG. 3.

FRMV 100 is structured to receive solder and flux residue. Specifically, FRMV 100 provides sufficient internal volume and internal surface area so as to attract excess solder and flux into the FRMV 100 and away from the external pad 126. FIG. 3 illustrates an exemplary result of the reflowing process, specifically showing solder 300 upon the pad 126 and within the chamber. The flux 302 has pooled upon the cooled solder 300 and is substantially within the second aperture 116. In at least one embodiment, the flux 302 is substantially within the FRMV 100 such that it may be described as being below the outer surface of the second aperture 116 and, more specifically, below the external solder-covered pad 126. Moreover, as the flux 302 is substantially within the FRMV 100 external flooding that would otherwise hamper if not otherwise preclude probe tip access to the solder covered pad 126.

Figure 4:
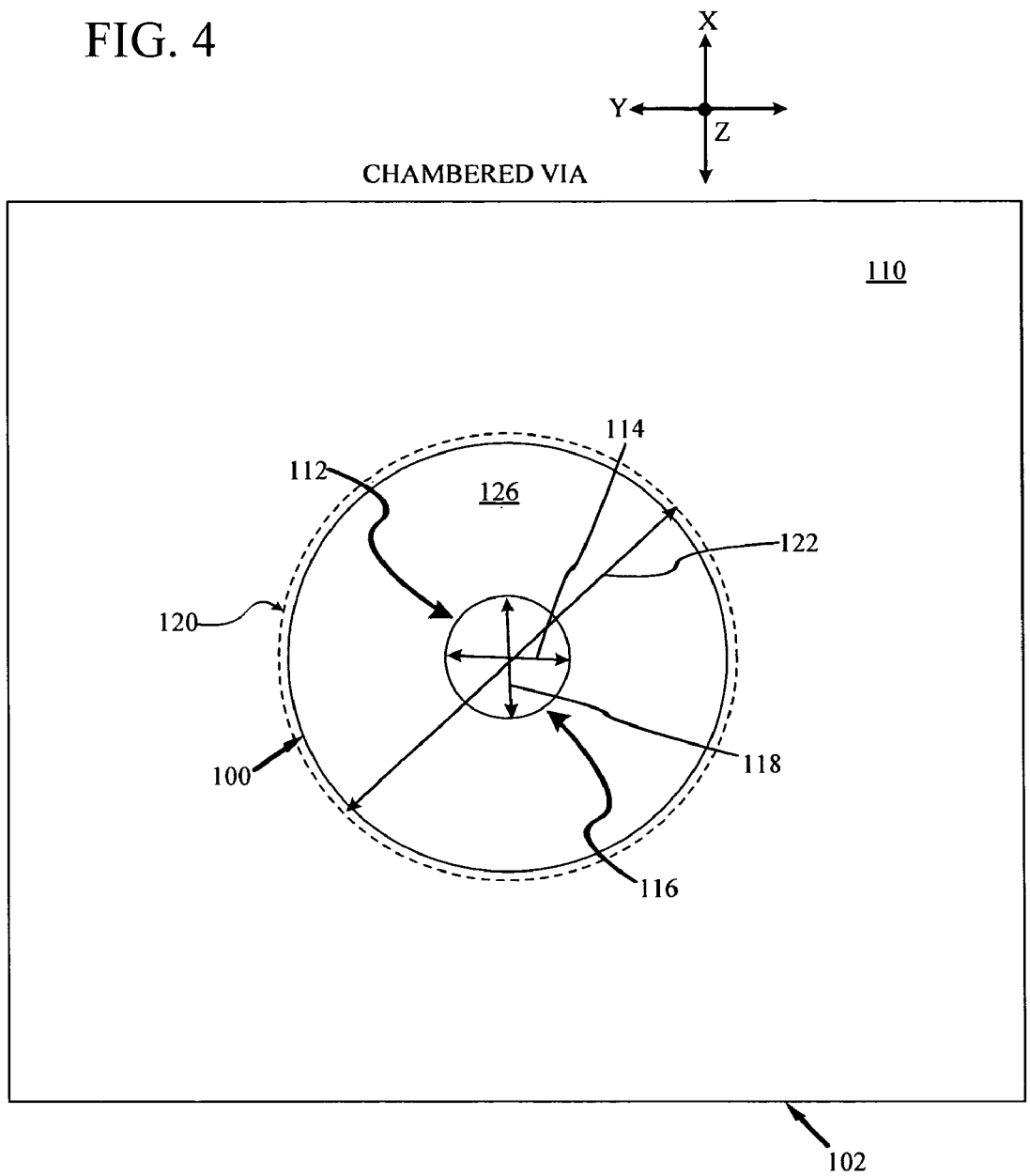
FIG. 4 is a bottom view of the FRMV shown in FIG. 1.

FIG. 4 is a bottom view of the FRMV 100 shown in FIG. 1, a view of the XY plane at second side 110. As is appreciated, the first aperture 112 and the second aperture 116 are vertically aligned. In addition, the dimension of the first diameter 114 being substantially equal to the dimension of the second diameter 118 is also easily appreciated. In at least one alternative embodiment, the first aperture 112 and second aperture 116 are not in perpendicular vertical alignment.

The chamber 120 is shown in dotted relief as it is internal to the PCA 102 and not otherwise obviously visible. The dimension of the third diameter 122 is also easily compared to the first and second diameters 114, 118 and appreciated to be substantially different.

It is understood and appreciated that design and fabrication methods may result in slight differences of diameter and alignment. However, as used herein, the notion of the first and second diameters 114, 118 being equal is that they are substantially equal within the intended tolerances of the design and fabrication techniques. It is further understood and appreciated that the third diameter 122 being larger is a dimension clearly evident by the design and fabrication techniques and not a mere variant due to tolerances in design and fabrication.

Figure 5:
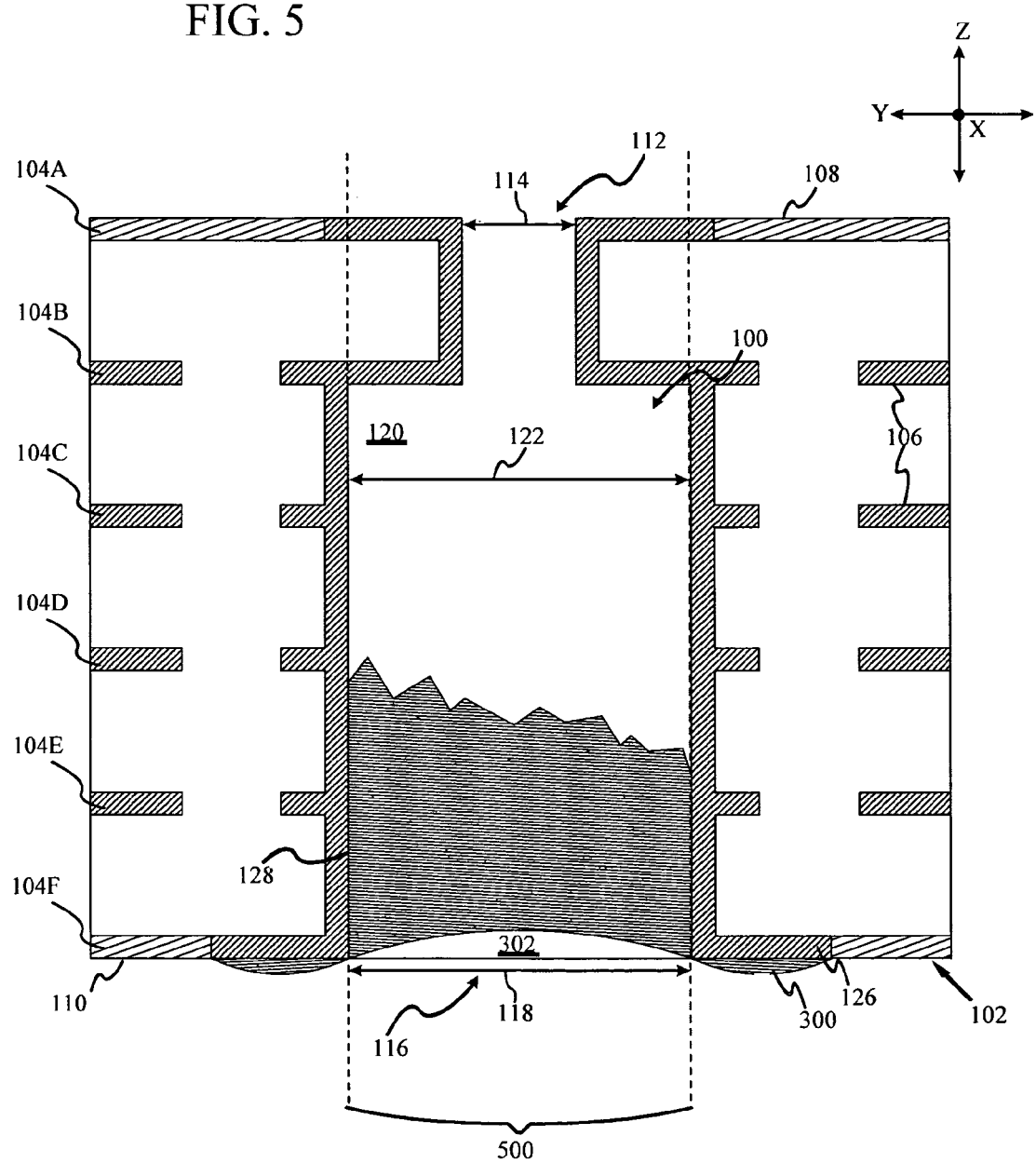
FIG. 5 is a cross-sectional view of an FRMV according to at least one alternative embodiment.

FIG. 5 presents a cross sectional view of the YZ Plane through PCA 102 showing a FRMV 100 according to an alternative embodiment. The illustration of FIG. 5 includes solder 300 to again illustrate FRMV 100 being structured and arranged to mitigate the presence of flux residue 302 by containing the excess solder and flux 302 substantially within the FRMV 100 such that it may be described as being below the outer surface of the second aperture 116 and, more specifically, below the external solder covered pad 126.

With respect to FIG. 5, FRMV 100 may be described as having a chamber 120 having a first aperture 112 with a first diameter 114 and opposite thereto a second aperture 116 with a second diameter 118. The chamber 120 has a third diameter 122 disposed between the first aperture 112 and the second aperture 116. Dotted lines 500 have been provided to further assist with comparing the dimensions of the three diameters.

As is evident, the first diameter 114 is no greater than the second diameter 118. As shown, the first diameter 114 is substantially smaller than the second diameter 118. In addition, the third diameter 122 is no smaller than the first diameter 114. As shown, the third diameter 122 is substantially larger than the first diameter 114. Further, at least two of the three diameters are of a different dimension; for example, as shown, the first diameter 114 being different from either the second diameter 118 or the third diameter 122.

As shown in this embodiment, the second diameter 118 and the third diameter 122 are substantially equal. It will be appreciated that the relationship of the first diameter 114 being no greater than the second diameter 118, and the third diameter 122 being no smaller than the first diameter 114 and at least two of the three diameters being of a different dimension is equally applicable to FRMV 100 shown in FIGS. 1, 3, 4.

Figure 6:
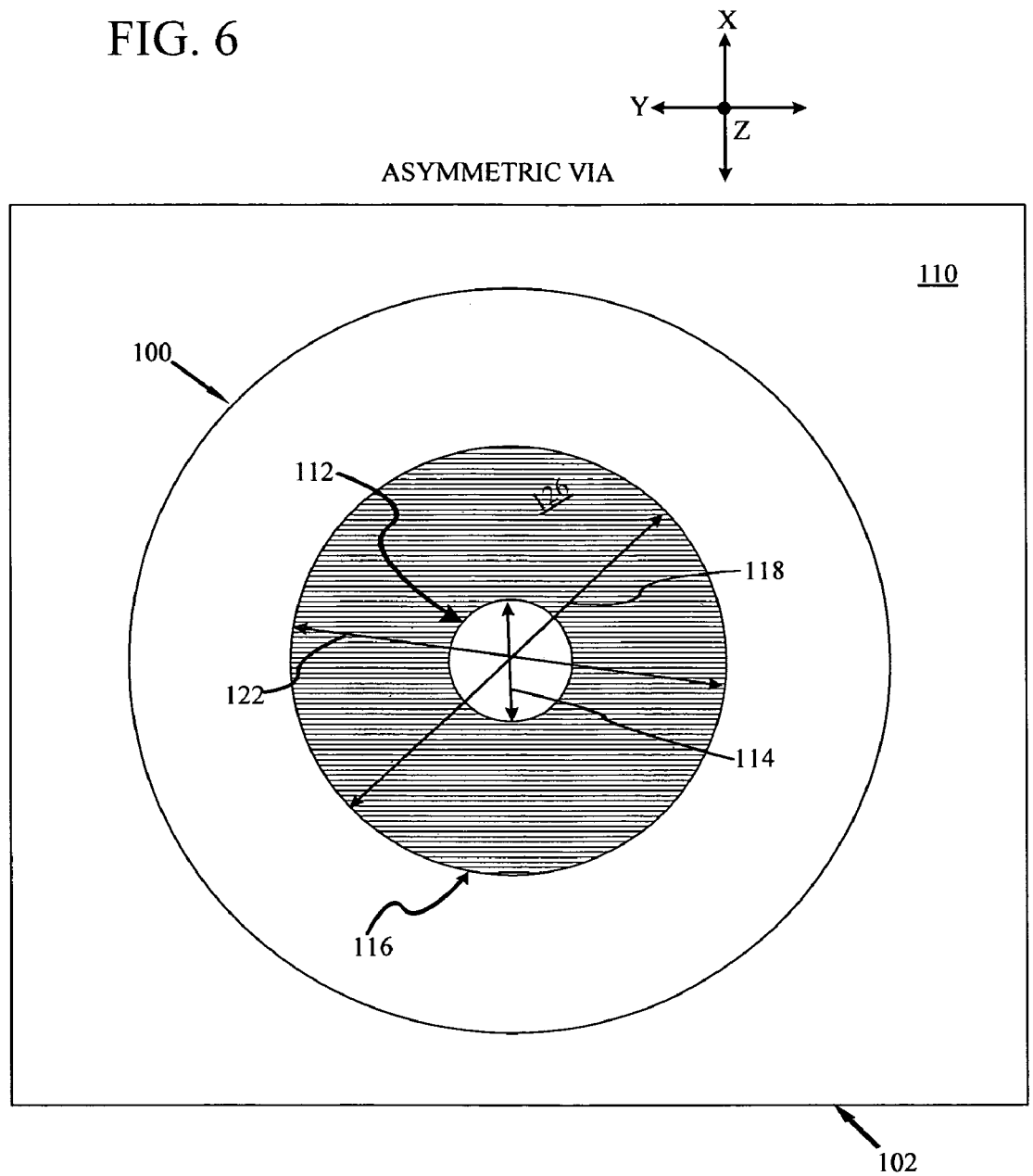
FIG. 6 is a bottom view of the FRMV shown in FIG. 5.

FIG. 6 is a bottom view of the FRMV 100 shown in FIG. 5, a view of the XY plane at second side 110 (absent the reflowed solder and flux omitted for clarity of FRMV 100). As in FIG. 4, it is appreciated that the first aperture 112 and the second aperture 116 are vertically aligned. In addition, the dimension of the second diameter 118 being substantially equal to the dimension of the third diameter 122, and these diameters being substantially larger than the dimension of the first diameter 114 is easily appreciated. It is also understood and appreciated that, in at least one alternative embodiment, the first aperture 112 and the second aperture 116 are not in perpendicular vertical alignment.

Figure 7:
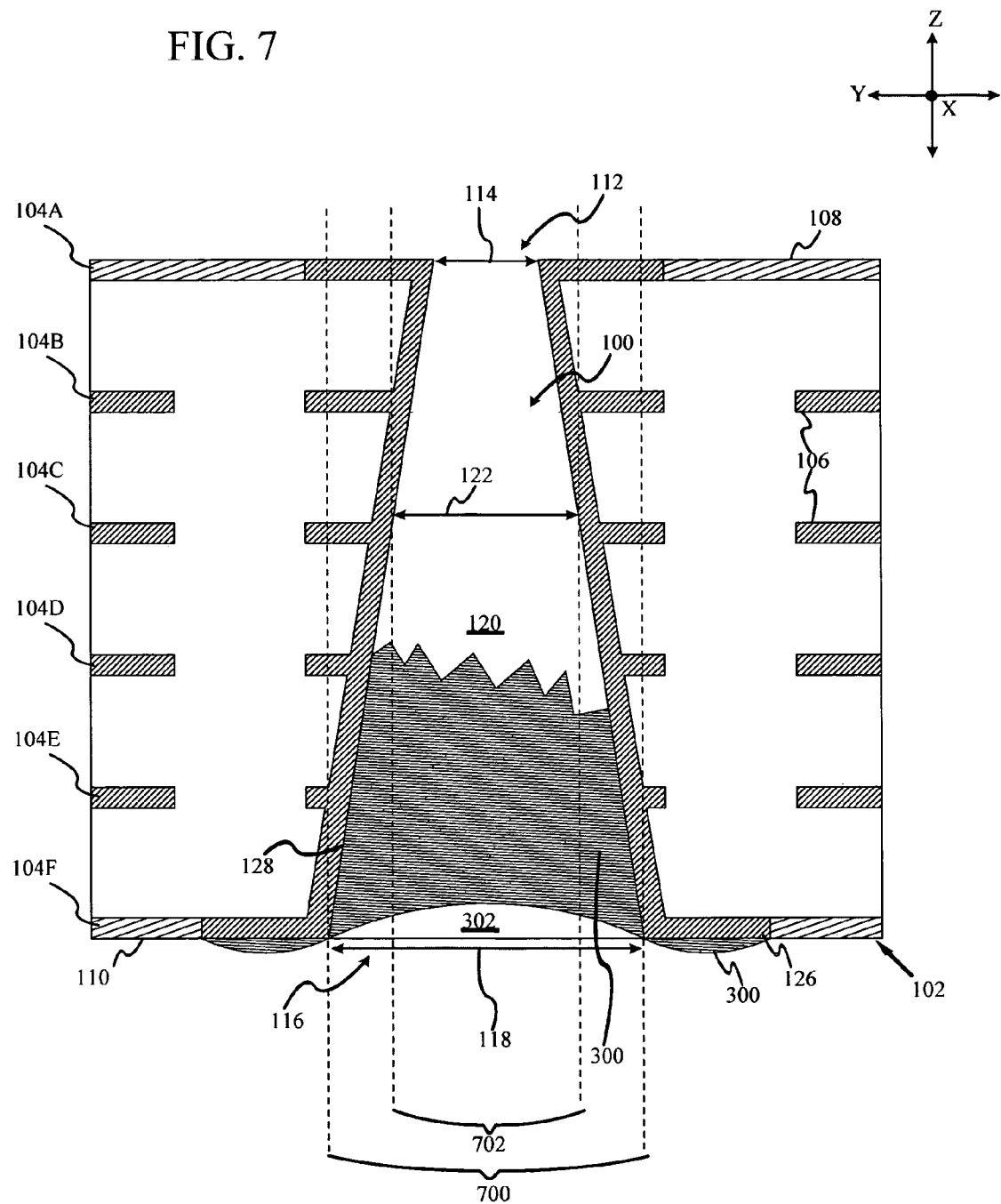
FIG. 7 is a cross-sectional view of an FRMV according to at least one other alternative embodiment.

FIG. 7 presents a cross-sectional view of the YZ Plane through PCA 102 showing a FRMV 100 according to yet another alternative embodiment. The illustration of FIG. 7 includes solder 300 to again illustrate FRMV 100 being structured and arranged to mitigate the presence of flux residue 302 by containing the excess solder and flux 302 substantially within the FRMV 100 such that it may be described as being below the outer surface of the second aperture 116 and, more specifically, below the external solder-covered pad 126.

With respect to FIG. 7, FRMV 100 may be described as having a chamber 120. The chamber 120 has at least a first, second, and third diameters 114, 116 and 122 disposed parallel and apart, at least two of the diameters being of a dimension larger or smaller than the remaining diameter. In addition, the first diameter 114 defines a first aperture 112 and the second diameter 118 defines a second aperture 116. As shown, the second aperture is disposed in second side 110 and the first aperture 112 is disposed in first side 108.

Figure 8:
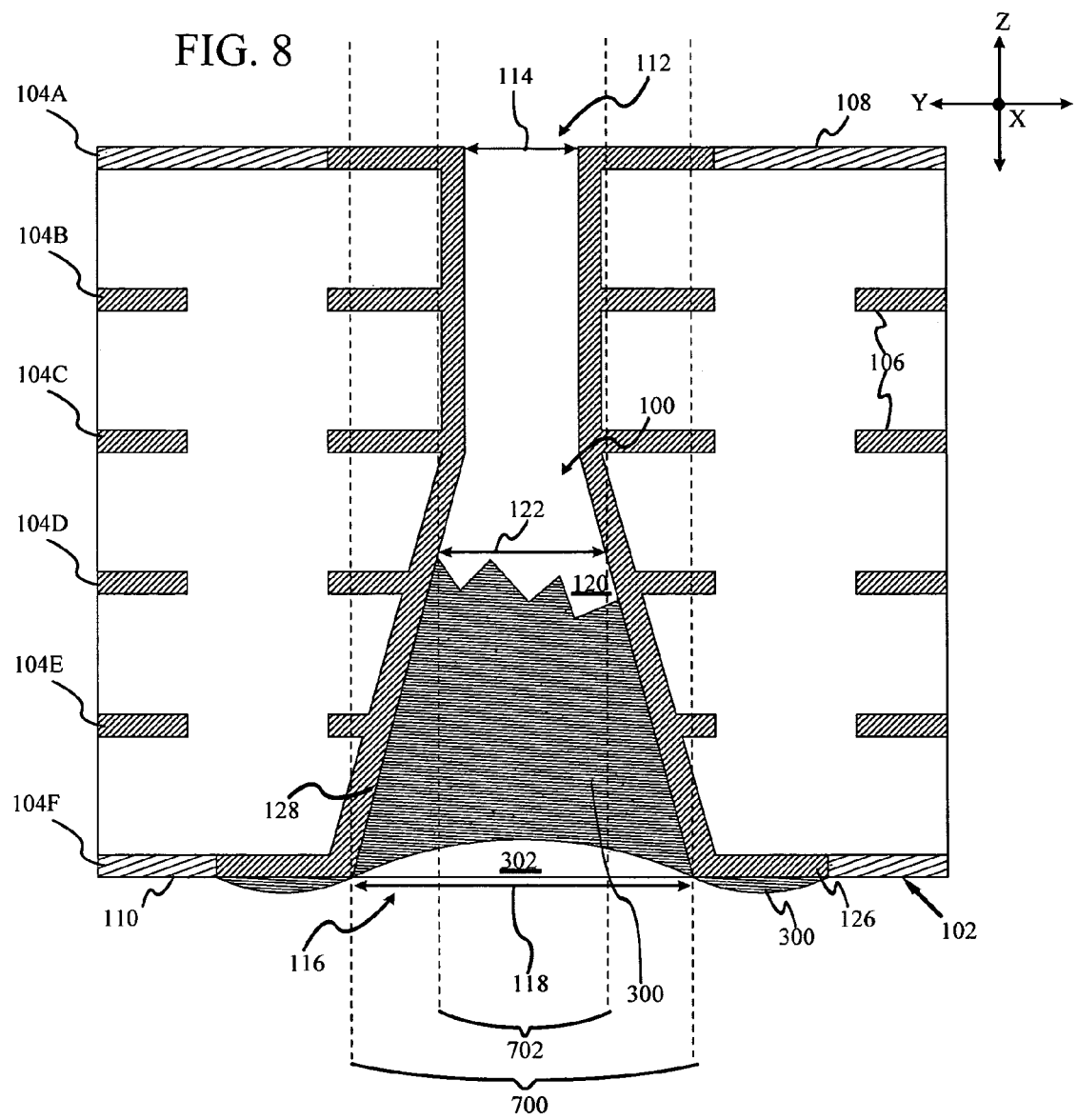
FIG. 8 is a cross-sectional view of a variation of FRMV shown in FIG. 7 according to an embodiment.

The sidewalls 128 of the FRMV 100 in FIG. 7 taper from the second aperture 116 towards the first aperture 112. As is evident, each diameter is different in this embodiment, the first diameter 114 being smaller than the third diameter 122, the third diameter 122 being smaller than the second diameter 118. Specifically, for the continuously tapering embodiment as shown in FIG. 7, the third diameter 122 is continuously decreasing as it moves from the adjacent to the second side 116 to adjacent to the first side 112. Dotted lines 700 and 702 have been provided to further assist with comparing the dimensions of the three diameters. FIG. 8 is a slight variation of the FRMV 100 shown in FIG. 7 wherein at least a portion of the sidewalls 128 taper from the second aperture 116 towards the first aperture 112, the taper ending about midway through the PCA 102.

Whereas the FRMV 100 of FIGS. 1 and 3 may be described as being a chambered via, and FRMV 100 of FIG. 5 may be described as being an asymmetric via, the FRMV 100 shown in either FIG. 7 or 8 may be described as a flared via. Regardless, it is to be appreciated that the relationship of the at least two diameters being of a dimension larger or smaller than the third dimension is equally applicable to all depicted embodiments.

FIG. 9 is a bottom view of the FRMV 100 shown in either FIG. 7 or 8, a view of the XY plane at second side 110 (absent the reflowed solder and flux omitted for clarity of FRMV 100). As in FIGS. 4 and 6, it is appreciated that the first aperture 112 and the second aperture 116 are vertically aligned. It is also understood and appreciated that, in at least one alternative embodiment, the first aperture 112 and the second aperture 116 are not in perpendicular vertical alignment.

With respect to FIG. 9 it is appreciated that each diameter dimension is different, i.e. as shown, the first diameter 114 is smaller than the second diameter 118. The third diameter 122 is larger than the first diameter 114 and smaller than the second diameter 118.

With respect to the embodiments of FRMV 100 shown in FIGS. 5, 6, 7, 8 and 9, it is also appreciated that as second aperture 116 is larger than first aperture 112, the solder receiving test pad 126 concentrically joined to the second aperture provides greater surface area for test probe targeting than is provide on first side 108. Such increased test probe target area may advantageously improve the accuracy of testing and reduce false negatives due to test probe misalignment and/or failure to contact at least a portion of the test pad 126. Further, in at least one embodiment, the diameter of the second aperture 116 is about greater than or equal to 1.25 times the diameter of the first aperture 112. Moreover, in at least one embodiment the smallest diameter of FRMV 100 is about less than or equal to three quarters the size of the largest diameter of FRMV 100.

In addition, with respect to the figures as shown, FRMV 100 is appreciated to provide better test tip access at the bottom of the board (e.g. second side 110) with such improved access taking minimal space on the opposite side of the board (e.g. first side 108). As such, FRMV 100 permits densely packed components to exist on the first side 108 while still providing improved test point access on the second side 110.

It is also appreciated that as shown in the figures, in at least one embodiment FRMV 100 is a unitary structure. More specifically the sidewall that define the first aperture 112 are integral to the sidewalls that define the chamber 120, and are further integral to the sidewalls that define the second aperture 116 and the solder receiving test pad 126. In addition, in at least one embodiment the transition of the sidewalls from the first aperture 112 to the chamber 120 and from the chamber 120 to the second aperture 116 and from the second aperture 116 to the solder receiving test pad 126 is smooth and continuous without gaps, joint ridges or other defects that would retard or otherwise frustrate the flow of solder and flux into the FRMV 100 so as to leave the test pad 126 substantially free of flux residue or flux obstruction.

As the FRMV 100 shown in FIGS. 1 and 3 has a chamber 120, the enlarged portion of which is disposed entirely within the PCA 102 between the first side 108 and the second side 110, this embodiment of FRMV 100 is perhaps most easily provided by pre-drilling the layers 104B~104E during PCA 102 fabrication, i.e. the assembly of the layers. As such, this configuration of FRMV 100 is well suited to PCAs having four or more layers.

Figure 10:
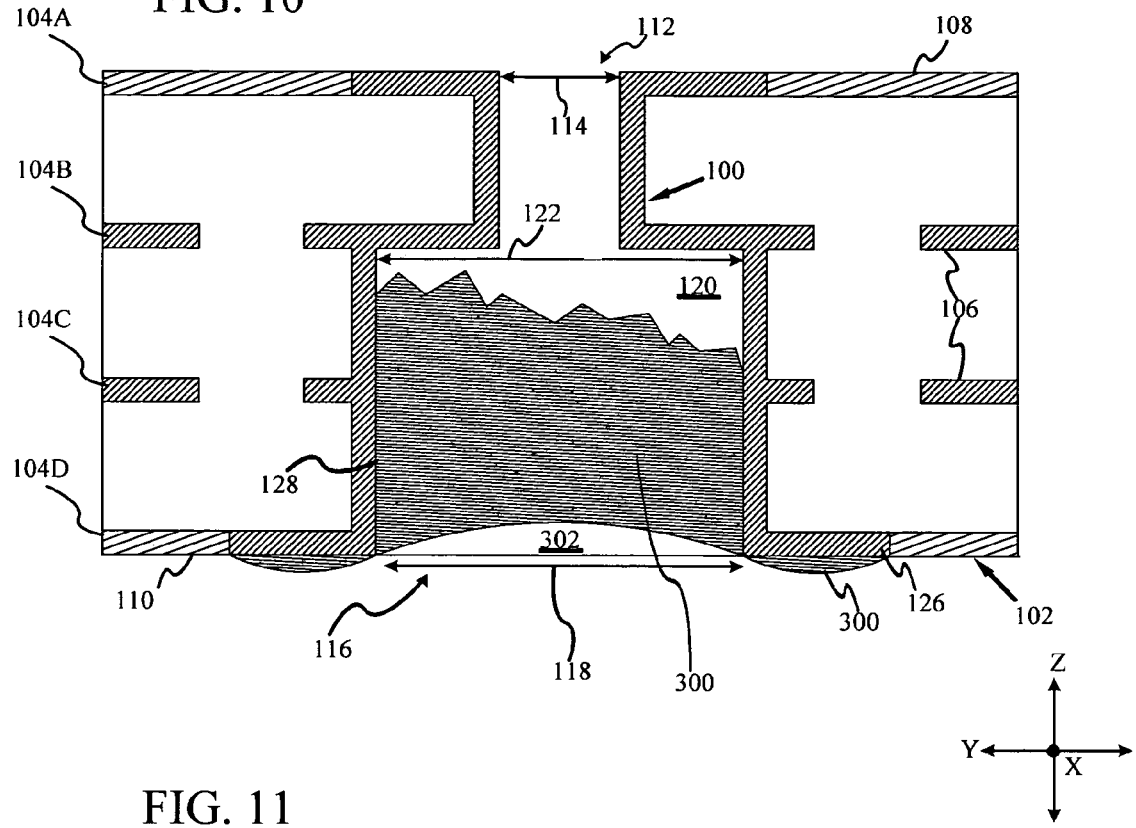
FIG. 10 is a cross-sectional view of yet another FRMV in accordance with an embodiment.
Figure 11:
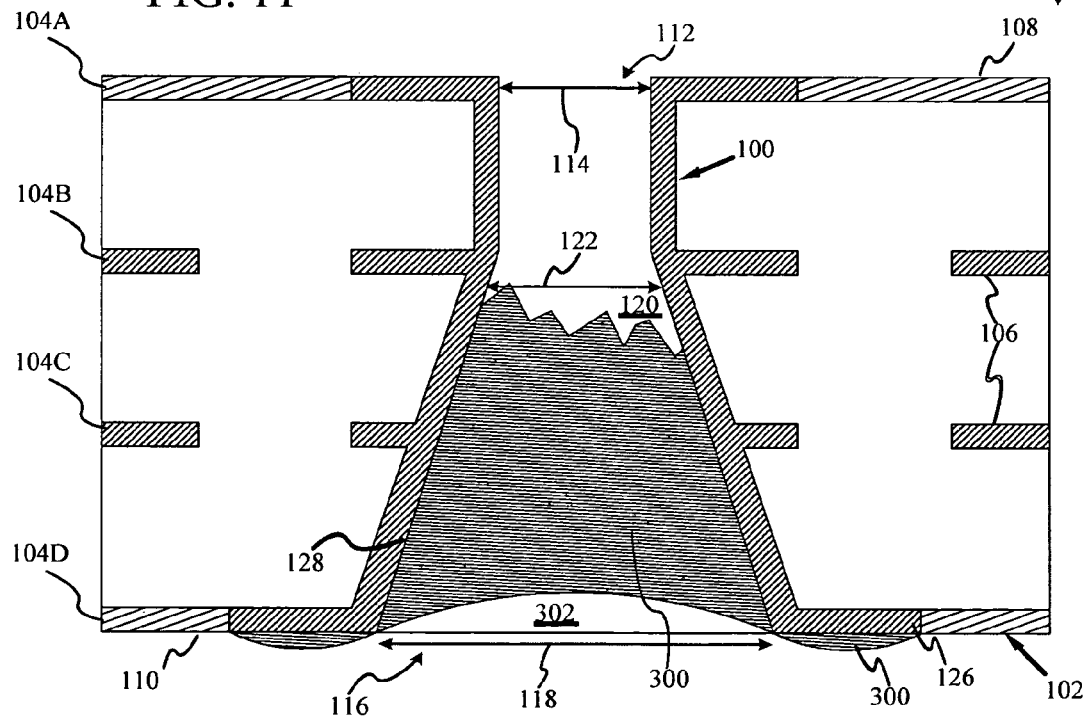
FIG. 11 is a cross-sectional view of still another FRMV in accordance with an embodiment.
Figure 12:
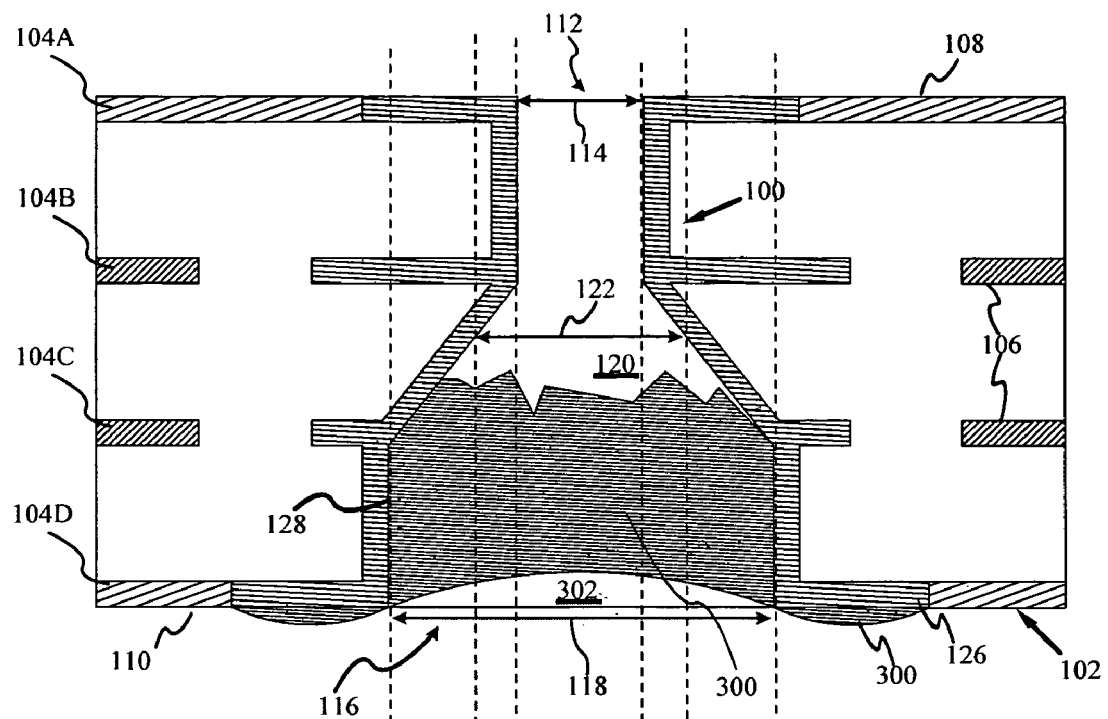
FIG. 12 is a cross-sectional view of yet still another FRMV in accordance with an embodiment.

As PCAs do exist having fewer layers, FIGS. 10, 11 and 12 provide cross-sectional views of FRMV 100 embodiments adapted to PCA's having four layers. Moreover, the asymmetric FRMV 100 shown in FIG. 10, the flared FRMV 100 shown in FIG. 11, or the hybrid asymmetric and flared FRMV 100 shown in FIG. 12 may be provided post layer assembly, or by pre-drilling each layer. It should also be understood that, the FRMV 100 may also-be utilized with PCA's having only two layers (not shown).

In at least one embodiment the flared, asymmetric or hybrid asymmetric-flared FRMV 100 is provided with the use of a two stage drill that provides the second aperture 116 with the second diameter 122, the chamber 120 with the third diameter 122 and the first aperture 112 with the first diameter 114 in a single drilling process.

Figure 13:
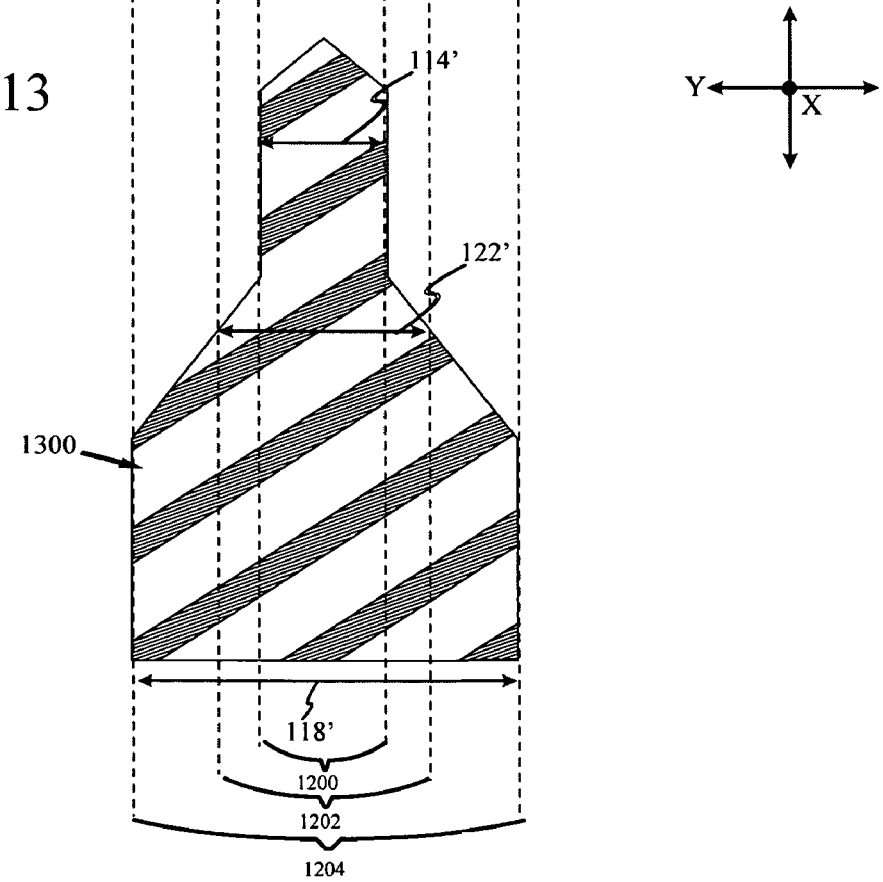
FIG. 13 is a cross sectional view of a multi-step drill as may be used to provide the FRMV shown in FIG. 12.

FIG. 13 is provided to illustrate such a multi-stage drill bit, and more specifically a two stage drill bit 1300 that may be used to provide the FRMV 100 shown in FIG. 12. Dotted lines 1200, 1202 and 1204 are provided to assist in realizing that drill bit 1300 provides at least three diameter dimensions, i.e., dimension 114' corresponding to first diameter 114, dimension 118' corresponding to second diameter 118, and a dimension 122' corresponding to dimension 122.

Changes may be made in the above methods, systems, processes and structures without departing from the scope hereof. It should thus be noted that the matter contained in the above description and/or shown in the accompanying drawings should be interpreted as illustrative and not in a limiting sense. The following claims are intended to cover all generic and specific features described herein, as well as all statements of the scope of the present method, system and structure, which, as a matter of language, might be said to fall therebetween.

What is claimed is:

1. An electrically conductive via for reducing flux residue, comprising:
   a chamber having a first aperture with a first diameter and opposite thereto a second aperture with a second diameter, the chamber having a third diameter between the first and second apertures;
   the first diameter being no greater than the second diameter;
   the third diameter being no smaller than the first diameter, at least two of the three diameters being of a different dimension; and
   a solder-receiving test pad concentrically joined to the second aperture, wherein the third diameter is located in the chamber that includes solder and non-conductive flux residue.

2. The via of claim 1, wherein the chamber has sidewalls between the first aperture and the second aperture, at least a portion of the sidewalls tapering from the second aperture towards the first aperture.

3. The via of claim 1, wherein the first diameter and the second diameter are equal, the third diameter being larger.

4. The via of claim 1, wherein the second diameter and the third diameter are equal, the first diameter being smaller.

5. The via of claim 1, wherein the third diameter has a smaller dimension than the second diameter, and the first diameter has a smaller dimension than the third diameter.

6. The via of claim 1, wherein each of the first aperture, the second aperture, and the chamber has a different diameter.

7. An electrically conductive via for reducing flux residue and improving test point access, comprising:
   a chamber having at least a first, second and third diameter disposed parallel and apart from each other, the first and second diameters being of a dimension different than the third diameter;
   the first diameter defining a first aperture and the second diameter defining a second aperture; and
   a solder-receiving test pad concentrically joined to the second aperture and located external to the chamber, wherein the third diameter is located in the chamber that includes solder and non-conductive flux residue.

8. The via of claim 7, wherein the chamber has sidewalls between the first aperture and the second aperture, at least a portion of the sidewalls tapering from the second aperture towards the first aperture.

9. The via of claim 7, wherein the first diameter and the second diameter are equal, the third diameter being larger.

10. The via of claim 7, wherein the first diameter and the second diameter are equal, the first and second diameters being smaller than the third diameter.

11. The via of claim 7, wherein the third diameter has a smaller dimension than the second diameter, and the first diameter has a smaller dimension than the third diameter.

12. The via of claim 7, wherein the second diameter is larger than the first diameter, and the third diameter is larger than the first diameter but smaller than the second diameter.

13. A printed circuit assembly (PCA), comprising:
   a plurality of circuit board layers and electrical traces disposed between a first side and a second side;
   a via that extends through the PCA from the first side to the second side and makes contact with the electrical traces, and includes a first aperture at the first side, a second aperture at the second side, a test pad at the second side, and an internal chamber;

flux within the via and below an outer surface of the second aperture; and solder that covers a portion of the test pad, wherein each of the first aperture, the second aperture, and the internal chamber has a different diameter.

14. The printed circuit assembly of claim 13, wherein the test pad has a greater surface area than a surface area of the first aperture.

15. The printed circuit assembly of claim 13, wherein the flux is located below the solder that covers the test pad.

16. The printed circuit assembly of claim 13, wherein the solder is substantially within the chamber and below the outer surface of the second aperture.

17. The printed circuit assembly of claim 13, wherein the first and second apertures have a size and a shape that are different than a size and a shape of the internal chamber.

18. The printed circuit assembly of claim 13, wherein the plurality of circuit board layers include four or more layers.

19. The printed circuit assembly of claim 13, wherein the flux is within the chamber and below the first aperture, the second aperture, and the test pad.

20. The printed circuit assembly of claim 13, wherein the via provides an internal volume and internal surface area to attract excess solder and flux into the via and away from the test pad.

* * * * *